(12) United States Patent
Braunisch

(10) Patent No.: US 7,280,024 B2
(45) Date of Patent: Oct. 9, 2007

(54) INTEGRATED TRANSFORMER STRUCTURE AND METHOD OF FABRICATION

(75) Inventor: Henning Braunisch, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 190 days.

(21) Appl. No.: 11/050,379

(22) Filed: Feb. 2, 2005

(65) Prior Publication Data

US 2006/0170527 A1 Aug. 3, 2006

(51) Int. Cl.
*H01F 5/00* (2006.01)
(52) U.S. Cl. ..................... 336/200; 257/531
(58) Field of Classification Search ............. 336/65, 336/83, 200, 232; 438/381; 257/528, 531
See application file for complete search history.

(56) References Cited

U.S. PATENT DOCUMENTS

| | | | | |
|---|---|---|---|---|
| 2,997,695 A * | 8/1961 | Conger et al. | ............... | 365/173 |
| 4,785,345 A * | 11/1988 | Rawls et al. | ................ | 257/531 |
| 5,478,773 A * | 12/1995 | Dow et al. | .................. | 438/381 |
| 6,005,466 A * | 12/1999 | Pedder | ........................ | 336/200 |
| 6,362,525 B1 * | 3/2002 | Rahim | ........................ | 257/738 |
| 6,713,375 B2 * | 3/2004 | Shenoy | ....................... | 438/612 |
| 6,943,658 B2 * | 9/2005 | Gardner | ...................... | 336/200 |
| 6,951,794 B2 * | 10/2005 | Minami | ...................... | 438/381 |
| 7,091,576 B2 * | 8/2006 | Yamamoto et al. | ......... | 257/531 |

* cited by examiner

*Primary Examiner*—Tuyen T. Nguyen
(74) *Attorney, Agent, or Firm*—Blakely, Sokoloff, Taylor & Zafman LLP

(57) ABSTRACT

A microelectronic assembly including a die substrate, a plurality of electronic components formed in and on the die substrate and connected to one another to form an integrated circuit, a first and a second single-turn inductor, and a magnetic material electro-magnetically coupling the first and the second single-turn inductor to one another to form a transformer, the transformer being connected to the integrated circuit.

18 Claims, 15 Drawing Sheets

INTEGRATED TRANSFORMER STRUCTURE AND METHOD OF FABRICATION

BACKGROUND

1. Field of the Disclosure

The present disclosure relates to the field of semiconductor devices and more specifically to an integrated transformer structure and its method of fabrication.

2. Discussion of Related Art

The need for transformers in semiconductor design dictates the use of discrete inductors or spiral inductors. The discrete inductor is in an off-chip, off-package configuration and requires long interconnects to connect the inductor to a chip. These interconnects have high impedances and result in large ohmic losses. Also, discrete inductors require extra space outside the chip package, which is difficult to provide for in high-density circuit board fabrication.

Spiral inductors are created through windings of metal thin films, usually on a semiconductor substrate. The first drawback of spiral inductors includes the large area necessary to create large inductances. Another drawback of spiral inductors includes the tendency of the inductors to have high resistances. This high resistance deteriorates the quality factor of the inductors, making them too lossy for such applications as power delivery. Furthermore, spiral inductors force the magnetic flux into the silicon substrate, causing both eddy current losses and interference with devices.

BRIEF DESCRIPTION OF THE DRAWINGS

FIG. 5e' is an overhead view of FIG. 5e showing trench regions formed in the magnetic layer.

DETAILED DESCRIPTION

Figure 1A:
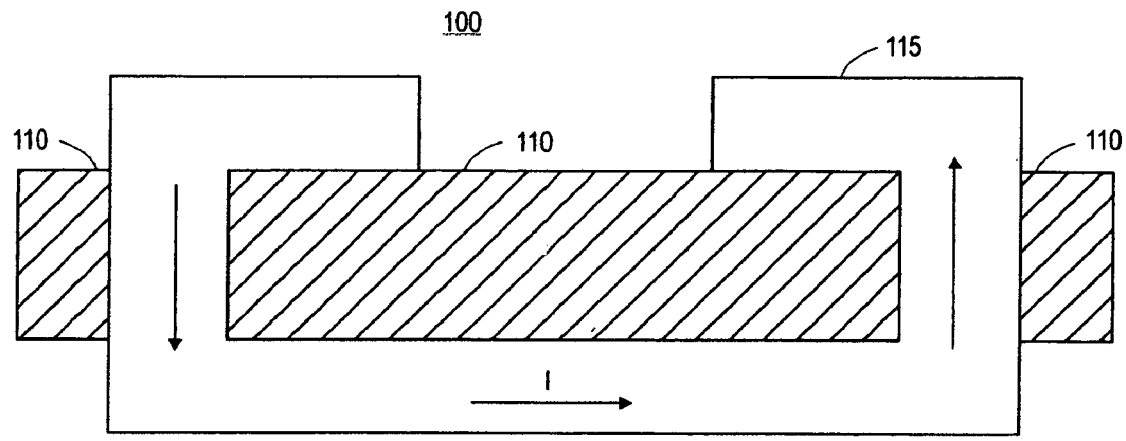
FIG. 1a is a cross-sectional view of an inductor structure, according to one embodiment of the invention.
Figure 1B:
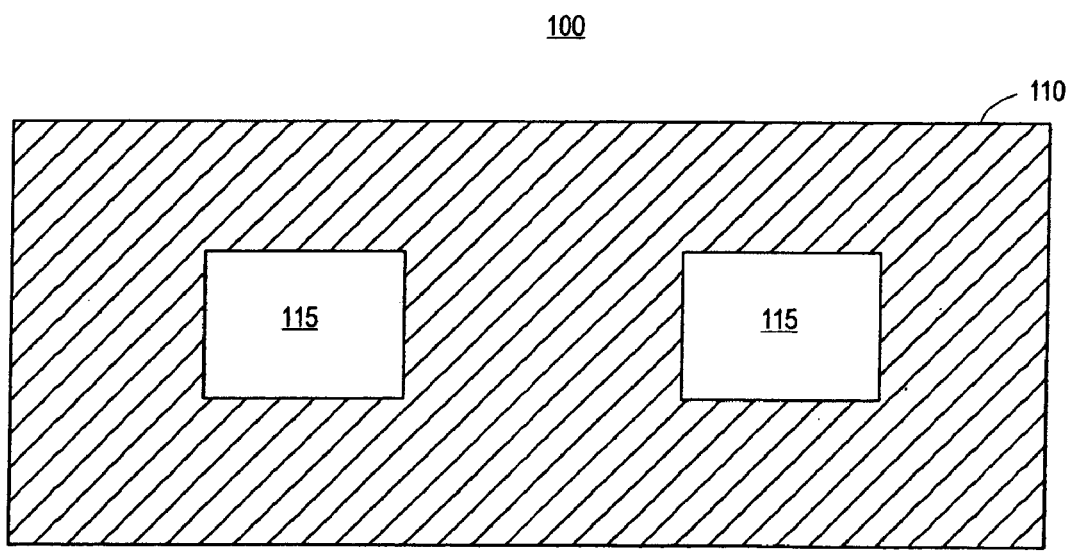
FIG. 1b is a top plane view of the inductor structure.

An embodiment of the present invention is an integrated transformer structure (as shown in FIGS. 7-12) and its method of fabrication using integrated inductor structure 100 (as shown in FIG. 1a). In an embodiment, the integrated inductor structure 100, as shown in FIG. 1a and FIG. 1b, is a solenoid structure 115 with a single-turn that is filled with and is surrounded by magnetic material 110. The magnetic material 110 enables a reduction of the inductor size because the magnetic material 110 has a relative magnetic permeability greater than one. This results in a higher inductance per area than an inductor without magnetic material. In an embodiment of the inductor structure 100, the area can be about 0.01-9 mm$^2$ with an inductance in the nanohenry (nH) range. The dimensions of the structure of the inductor can be altered to meet specific inductance and area requirements.

Another benefit of the magnetic material 110 is the encapsulation of the magnetic flux within the plane of the inductor structure 100, leading to a reduction of interference with surrounding components. In an embodiment, the single-turn solenoid structure enables an inductor with a low resistance. The low resistance and the capability of the inductor to provide inductances in the nanohenry range permit the use of the inductor in applications such as power delivery for integrated circuits.

Figure 2A:
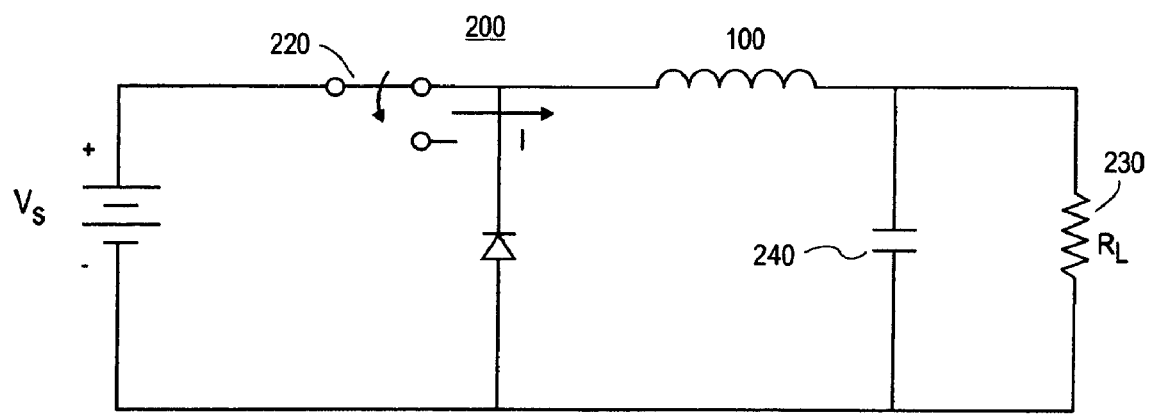
FIG. 2a is a circuit diagram of a buck converter circuit with the inductor and a switch in the on position.
Figure 2B:
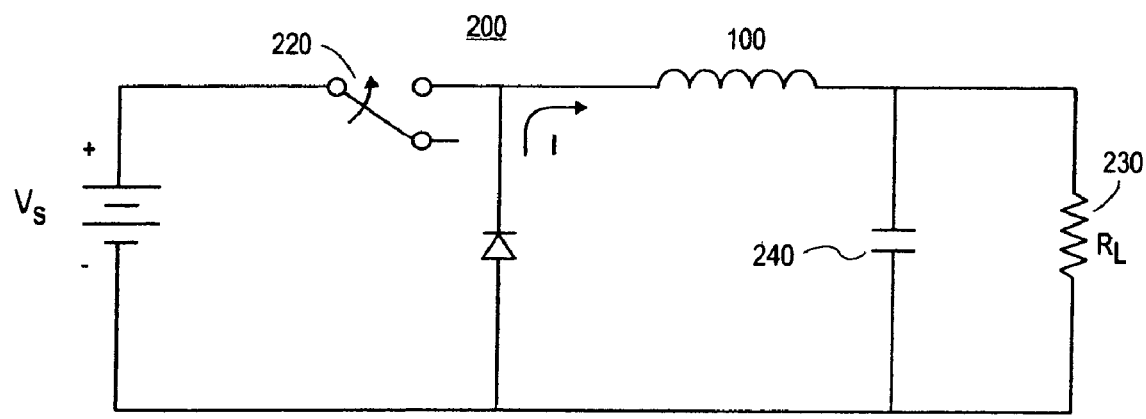
FIG. 2b is a circuit diagram like FIG. 2a with the switch in the off position.

One such power application includes the use in a buck converter circuit 200 as shown in FIGS. 2a and 2b. In the buck converter circuit 200 the inductor structure 100 and the capacitor 240 act as energy storage devices when the switch 220 is in the on position as shown in FIG. 2a. Once the switch 220 is placed in the off position, as shown in FIG. 2b, the inductor structure 100 acts like a source and works to maintain the current through the load resistor 230. Similarly, the capacitor 240 works to maintain the voltage across the load resistor 230.

In the embodiment of FIG. 1a, the layer of magnetic material 110 is formed around and within a conductive material 115 in a single loop configuration. The conductive material 115 can be formed from such materials including copper, tungsten, or aluminum. FIG. 1b shows the overhead view of the embodiment where the magnetic material 110 surrounds the conductive material 115 in the longitudinal plane of the inductor structure 100. In the embodiment the inductor structure 100 can be formed having an area of 0.11 mm$^2$ with a resistance less than 10 mΩ and an inductance of 10.1 nH. An embodiment of the inductor structure 100 can have a magnetic material 110 with the height of approximately 20-30 microns. This embodiment includes a conductive material 115 in the single loop configuration with a length of approximately 200-1000 microns, a width of approximately 350-450 microns, and a thickness of the conductive material 115 of approximately 20 microns.

In the embodiment the magnetic material 110 is composed of a soft magnetic material. Soft magnetic materials are easily magnetized and demagnetized. These properties make soft magnetic materials useful for enhancing or channeling flux produced by an electric current while minimizing hysteresis losses. One parameter used to distinguish soft magnetic materials is the relative permeability. The relative permeability indicates the amount of magnetic flux density, B, in a material over that contained in a vacuum when in the presence of a magnetic force field, H. In the embodiment of the inductor structure 100, the relative permeability is approximately 95-900. Generally, the relative permeability of an embodiment of the inductor structure 100 is approximately 100-500 and typically approximately 300. As mentioned earlier, materials with magnetic properties are used because the high permeability creates an increased magnetic flux resulting in a higher inductance over inductors without material with magnetic properties. In some embodiments of the inductor structure 100, the magnetic material 110 is a magneto-dielectric nanocomposite such as CoFeHfO. The magneto-dielectric in another embodiment is formed from magnetic nanoparticles embedded into a dielectric material. In one embodiment nanoparticles can be distributed throughout a host material such as a polymer host.

Figure 3:
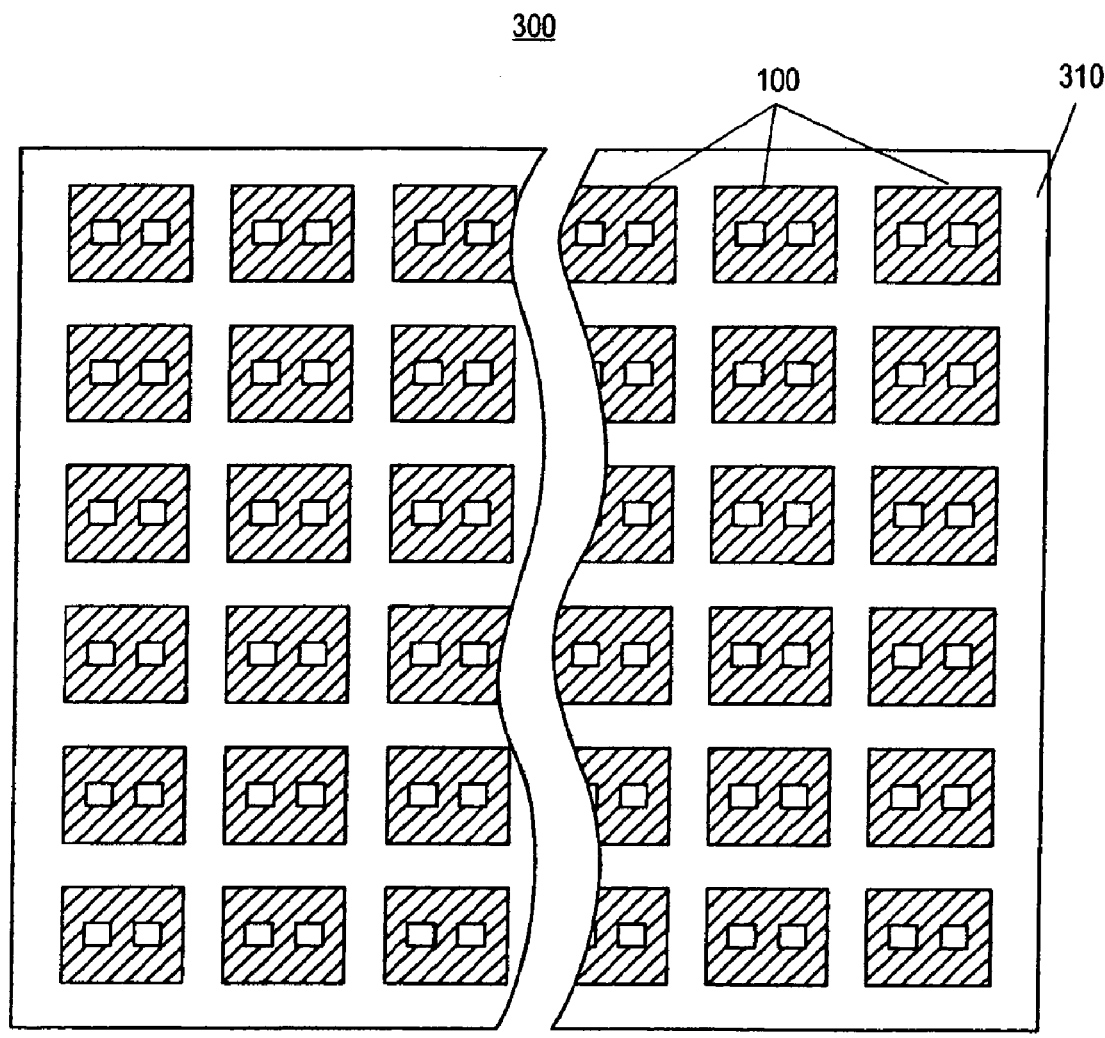
FIG. 3 is an overhead view of an array of the inductors.

As shown in FIG. 3, an embodiment of the inductor structure 100 includes fabrication of an inductor array 300 formed from a predetermined number of the inductor structures. In such an array, a dielectric material 310, including an Ajinomoto buildup film (ABF); a ceramic; or a solder resist, can be used to separate an inductor structure 100 from one another within the inductor array 300. One embodiment of an inductor array 300 can include approximately 9-10,000 inductor structures.

In an inductor array 300 embodiment, the inductor structure 100 can be connected to another inductor structure 100 in series, in parallel, and/or to devices external to the array. Series connections of an inductor structure 100 can be used to create inductance values equal to the sum of the inductors connected in series. Also, the inductor structure 100 in the inductor array 300 can be connected to another inductor structure 100 in parallel to tune the effective inductance of the combined inductor structure 100 connected together to a certain predetermined inductance. An individual inductor structure 100 in the inductor array 300, a combination of serially connected inductor structures 100, a combination of inductor structures 100 connected in parallel, or a combination of inductor structures 100 connected in series and in parallel can be used to connect to devices external to the inductor array 300. Examples of devices external to the inductor array 300 that could be connected to the inductor structure 100 include capacitors, voltage regulator modules, resistors, transistors and other devices useful in electronic design. Embodiments of the inductor array 300 can have the inductor structure 100 orientated on its side, upside down, or in other positions.

Figure 4:
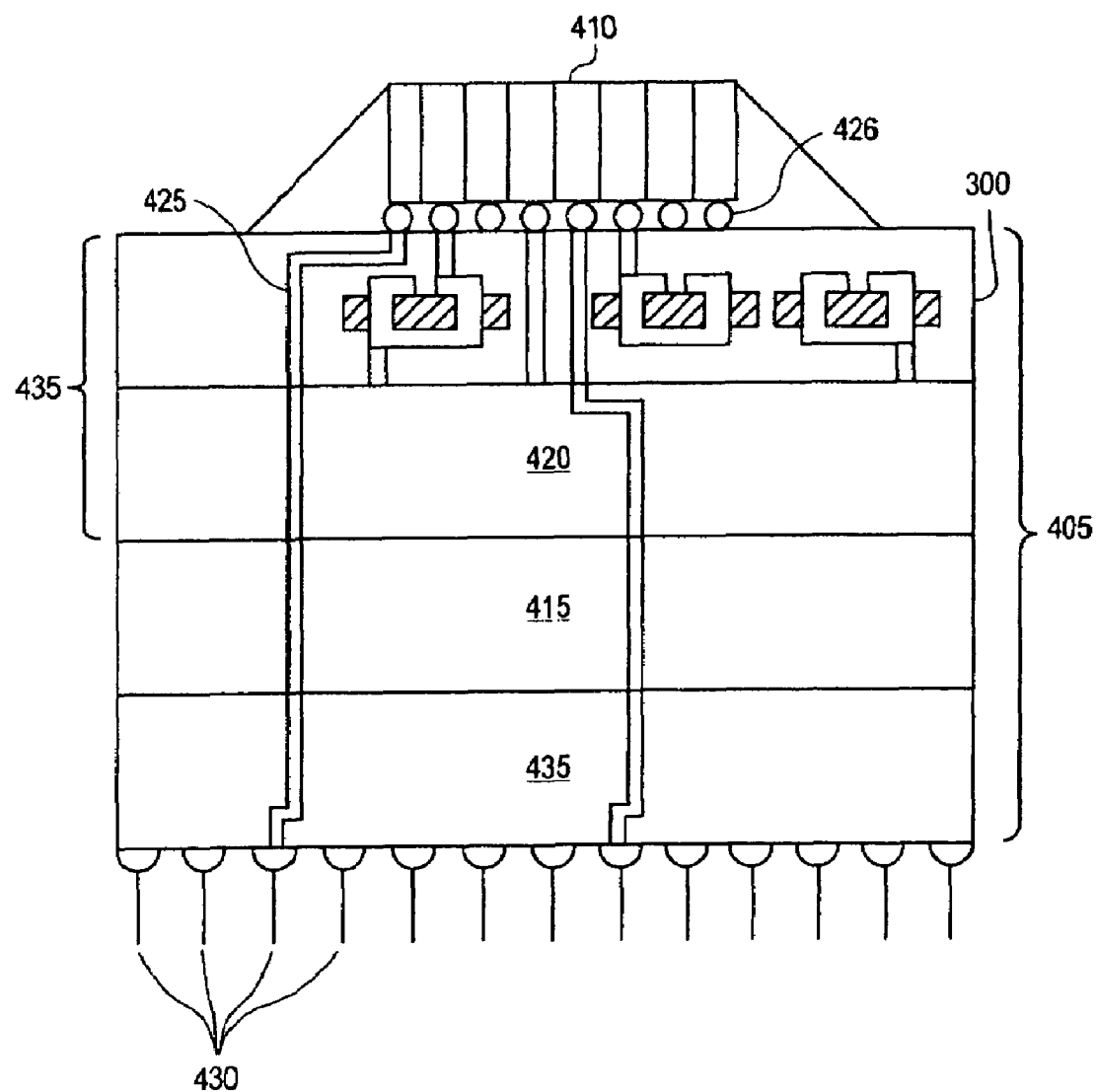
FIG. 4 is a cross-sectional side view of an inductor structure incorporated into the build-up package layers of an integrated circuit package.

As shown in FIG. 4, one embodiment of the inductor structure 100, such as an inductor array 300, can be fabricated into a build-up layer 435 of an integrated circuit package substrate 405. This build-up layer 435 could contain passive components including parallel-plate capacitors to form part of a power converter, such as a buck converter circuit 200. An embodiment of an inductor structure 100 in an inductor array 300 or a combination of connected inductors contained in an inductor array 300 contained within a build-up layer 435 can be used in conjunction with an array of voltage regulator modules (VRMs) 420 incorporated into a separate build-up layer 435. Such an embodiment can be used as a part of a power conversion circuit, such as a buck converter circuit 200, to power a die 410. One embodiment positions the inductor array 300 between a die 410 and an array of VRMs 420 as illustrated in FIG. 4. The voltage regulator elements of a build-up layer 435 convert a higher supply voltage to a lower voltage that is then coupled to the power grid of the die 410. Since the voltage regulators within the build-up layer 435 are separated from the circuits on the die 410 by the distance covered by the connections, which can be on the order of a few tens of microns in length, the lowered-voltage supply can be distributed in a manner minimizing IR and Ldi/dt voltage drops.

In an embodiment, an inductor structure 100 or an inductor array 300 can be coupled to a die 410 by die bonding techniques including flip-chip solder bumps 426, bumpless build-up layer (BBUL), or wire bond. In a BBUL embodiment, the package is built up around the die 410, so the die is contained within the package substrate core 415. The die 410 is then connected to a build-up layer 435 and/or input/output (I/O) pins 430 using interconnections 425. The two-dimensional interface and minimal separation distance between a build-up layer 435 and a die 410 helps ensure a further reduction of IR voltage drops and supply bottlenecks when compared to other die bonding techniques.

As illustrated in FIG. 4, the die 410 can be connected directly to I/O pins 430 through interconnects 425 including copper I/O interconnects or thru-vias that transverse the package substrate 405. The interconnects 425 within an integrated circuit package substrate 405 can connect an inductor structure 100, inductor array 300, a die 410 or other devices to external devices on a motherboard through the I/O pins 430. These I/O pins 430 can include but are not limited to metal leads, solder bumps, or wire in formations such as a pin grid array, a ball grid array, a ceramic column grid array, a leadless grid array, or a land grid array.

Because the build-up layer 435 is positioned in between the I/O pins 430 and the die 410, the build-up layer 435 can be made thin enough to allow a set of thru-vias to penetrate through the layer. The thru-vias are interconnections 425 that traverse the entire build-up layer 435 or package substrate core 415, while being insulated from the layer. In an embodiment, the thru-vias are situated around the perimeter of the build-up layer 435 and do not affect the devices contained within the build-up layer 435. An alternative embodiment does not include thru-vias. Instead, the devices in the build-up layer 435 and I/O pins 430 and the die 410 are coupled via I/O interconnect wires that run beyond the edge of the build-up layer 435.

Figure 5A:
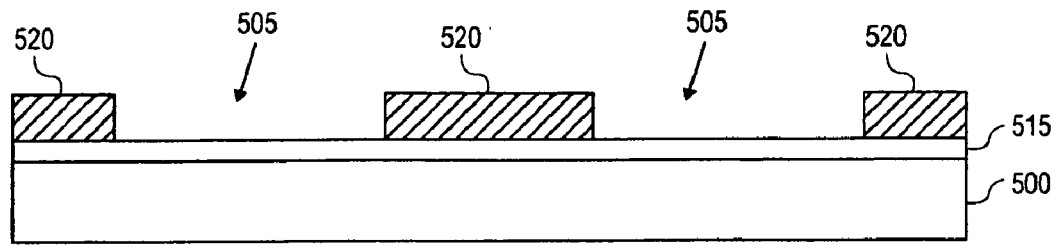
FIG. 5a is a cross-sectional side view of a seed layer and a photoresist mask formed on a package substrate for the formation of the inductor structure.
Figure 5B:
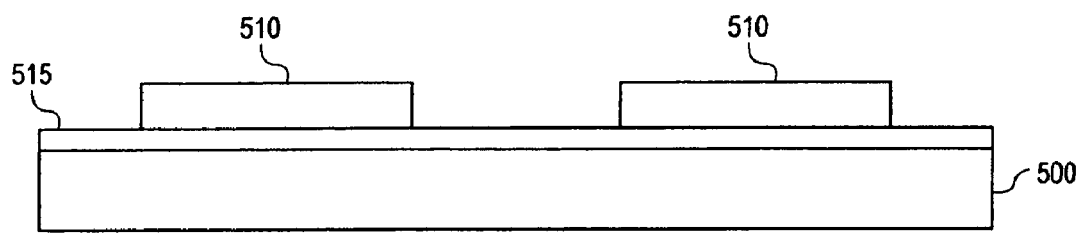
FIG. 5b is a view similar to FIG. 5a after a conductive layer is formed above the seed layer and around the photoresist mask, with the photoresist mask subsequently removed.
Figure 5C:
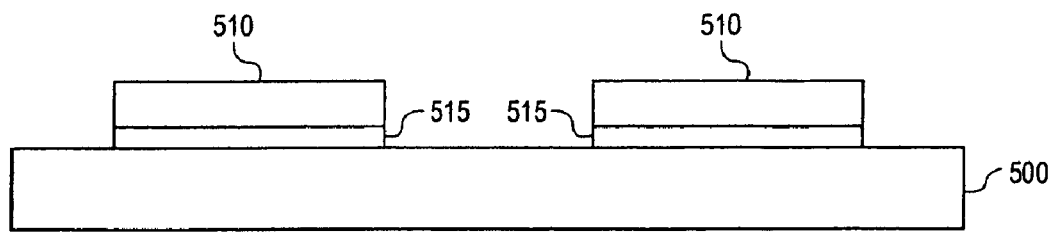
FIG. 5c is a view similar to FIG. 5b after a remaining exposed seed layer is removed around the conductive layer.
Figure 5D:
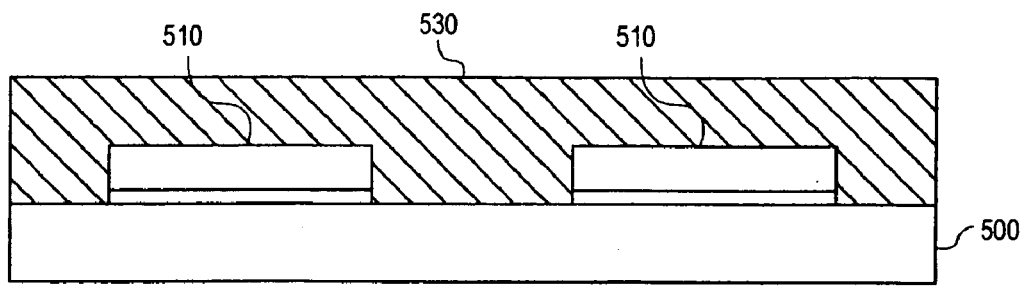
FIG. 5d is a view similar to FIG. 5c after a magnetic layer is formed over the conductive layer.

One fabrication method of the inductor structure 100 can be achieved through a modified version of a conventional high-density interconnect process as illustrated in FIGS. 5a-5h. FIG. 5a illustrates the formation of the first conductive layer 510 over a substrate 500 such as a printed circuit board by first forming a first seed layer 515 such as a copper seed layer. A technique to form the first conductive layer 510 includes forming a first photoresist mask 520 using well-known masking, exposing, and developing techniques over the substrate 500 to define the location 505 of the first conductive layer 510. In an embodiment, the first conductive layer 510 can be formed of a material such as copper, tungsten, or aluminum. In an embodiment using copper, well-know techniques such as electroplating can be used. The first photoresist mask 520 is removed using well-known techniques to form the structure illustrated in FIG. 5b. The exposed first seed layer 515 is etched away to produce the formation as shown in FIG. 5c. A layer of magnetic material 530 is formed over the package substrate layer 500 and the first conductive layer 510 as illustrated in FIG. 5d.

One method for forming the magnetic material 530 includes laminating one or many layers of a magneto-dielectric sheet until the optimal thickness is achieved. In an embodiment the thickness of the magnetic material can be approximately 30 microns. A method used to form a magneto-dielectric sheet includes co-sputtering a polymer with a magnetic material. Another method of forming the magnetic material 530 includes alternating layers of magnetic material with insulating material. The combination of the layers helps mitigate the effects of eddy currents when the inductor structure 100 is used at high frequencies of operation. In yet another method, the magnetic material 530 can be formed by sputtering until the preferred height of the material 530 is formed. One method of forming the magnetic material 530 includes an operation to planarize the magnetic material 530 after the material is deposited.

Figure 5E:
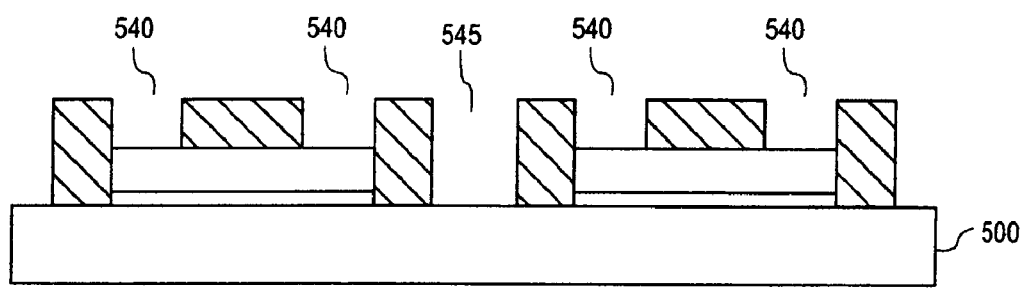
FIG. 5e is a view similar to FIG. 5d after trench regions are formed in the magnetic layer.

Next, as shown in a cross-sectional view in FIG. 5e and the overhead view in FIG. 5e', sidewall trenches 540 and isolation trenches 545 between each inductor structure 100 are formed by etching or typically by laser milling through the magnetic material 530 until the first conductive layer 510 is exposed. In one method, the conductive sidewalls 560 can be formed using vias. These sidewall vias can be formed of copper using well-known plating techniques. One embodiment of the method can employ a series of vias stacked upon each other until the sidewalls 560 are formed through the magnetic layer. Another method employs vias spaced apart from one another at predetermined distances.

Figure 5F:
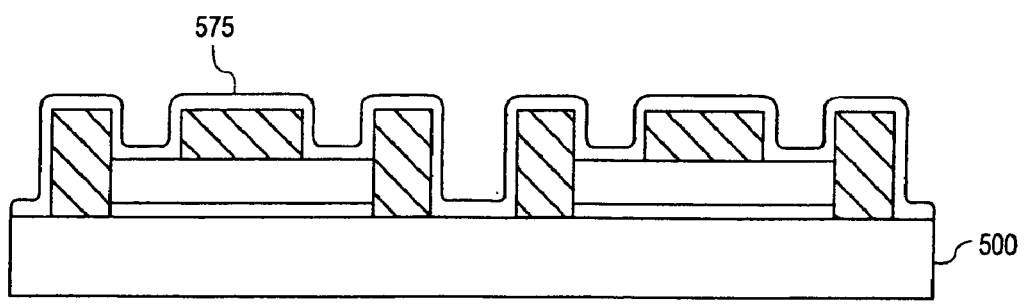
FIG. 5f is a view similar to FIG. 5e after a second seed layer is formed over the magnetic layer and the trench regions.
Figure 5E:
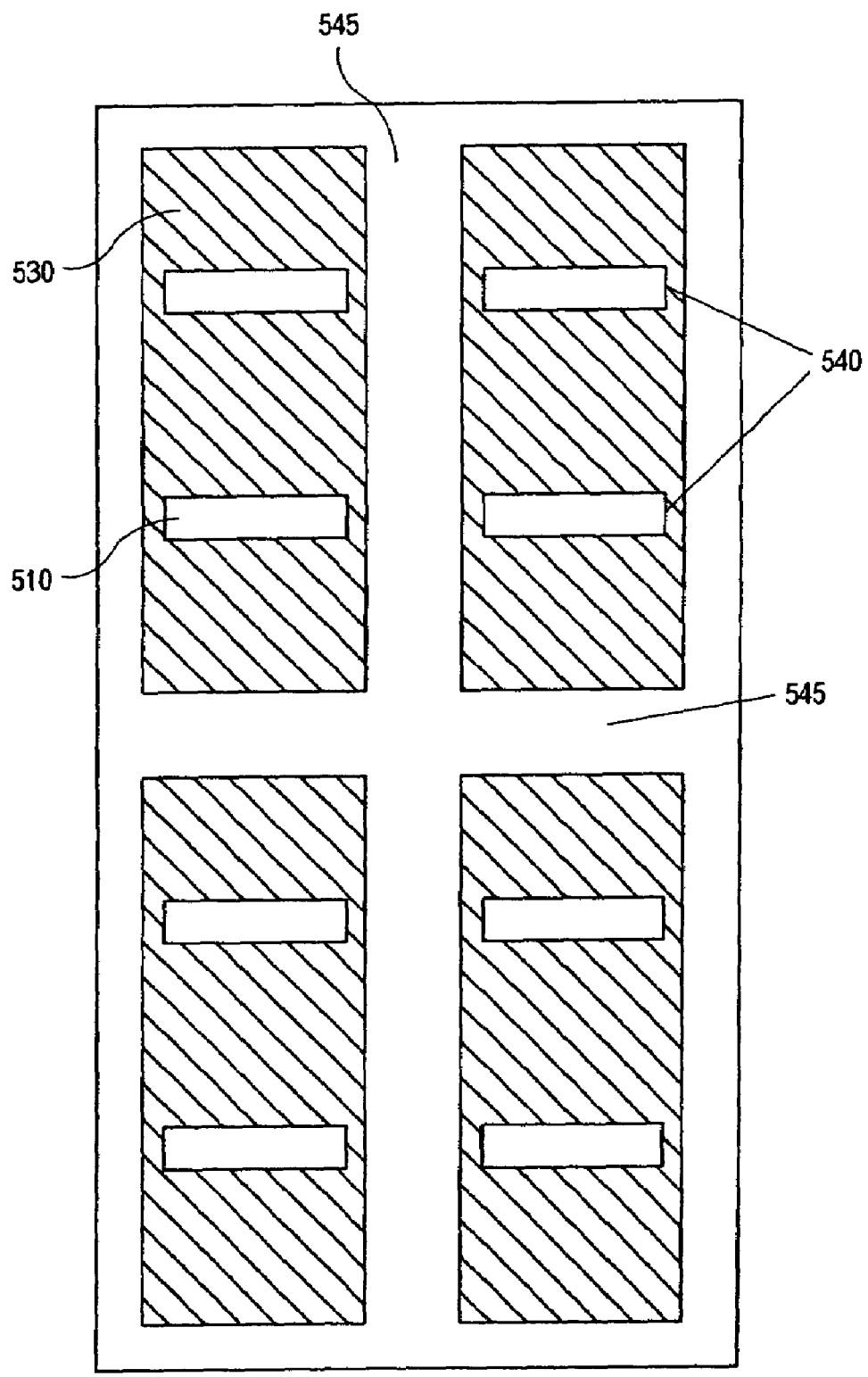
Figure 5G:
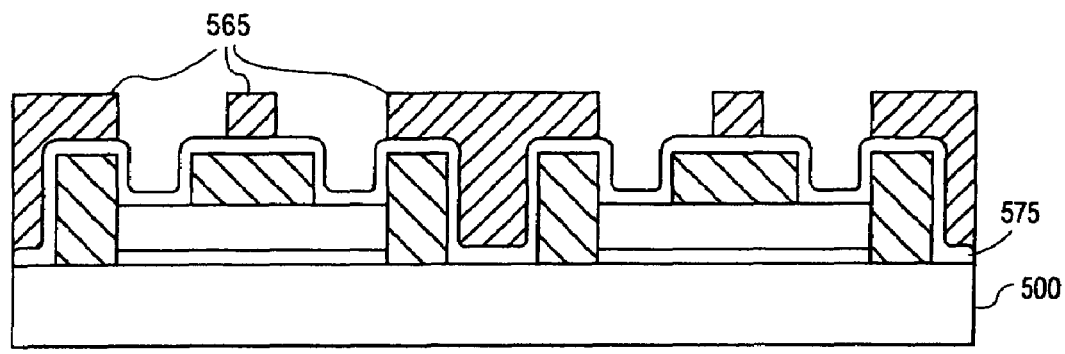
FIG. 5g is a view similar to FIG. 5f after a second photoresist mask is formed over the second seed layer.
Figure 5H:
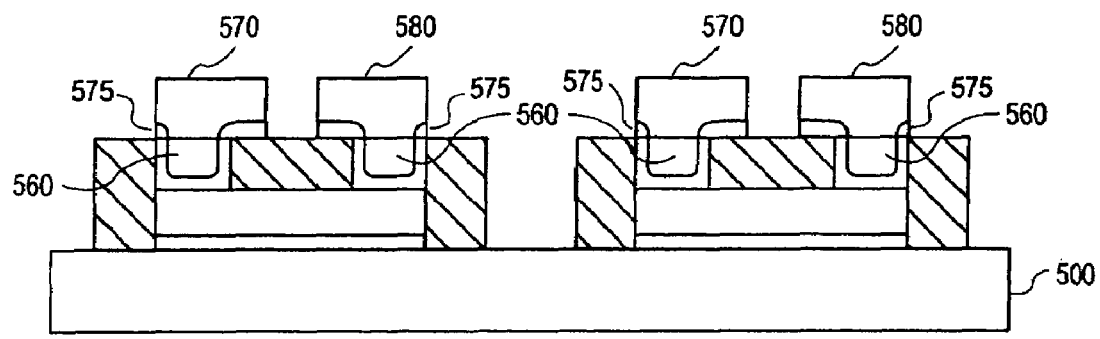
FIG. 5h is a view similar to FIG. 5g after sidewalls are formed through the magnetic layer with a second and third conductive layer formed over the magnetic layer.

FIGS. 5f and 5g illustrate an operation of one technique used to form the sidewalls 560, the second conductive layer 570, and the third conductive layer 580. As FIG. 5f shows, the first operation includes forming a second seed layer 575 over the formation shown in FIG. 5e. Once the second seed layer 575 is formed, a second photoresist mask 565 illustrated in FIG. 5g is formed to define the second conductive layer 570 and the third conductive layer 580 illustrated in FIG. 5h. The second photoresist mask 565 also prevents conductive material from filling the isolation trench 545. The sidewall trenches 540 are then filled with a conductive material to form conductive sidewalls 560 coupled to the first conductive layer 510 as illustrated in FIG. 5h. A second conductive layer 570 is formed over one conductive sidewall 560 such that the second conductive layer 570 is coupled to a conductive sidewall 560. The second conductive layer 570 overlays a portion of the magnetic material 530 toward the other conductive sidewall 560. A third conductive layer 580 is formed to couple with the other conductive sidewall 560. The third conductive layer 580 also covers part of the center portion of the magnetic material 530 as shown in FIG. 5h.

One method incorporates the creation of the second conductive layer 570, third conductive layer 580, and the sidewalls 560 into one operation after the formation of a second photoresist mask 565. After the second photoresist mask 565 defines the pattern for the second conductive layer 570 and third conductive layer 580, a conductive material can be formed using well-known techniques such as electroplating. Once the second conductive layer 570, the third conductive layer 580, and the sidewalls 560 are formed, the second photoresist mask 565 can be removed by well-known techniques resulting in the structure shown in FIG. 5h.

In a method to form the inductor structure 100, a dielectric layer is formed over the structure shown in FIG. 5h and within the isolation trench 545. The dielectric layer can be an Ajinomoto buildup film (ABF), a ceramic, or a solder resist. In one embodiment, a further operation of creating openings in the dielectric layer to expose circular areas of the conductive material of the second conductive layer 570 and the third conductive layer 580 could be used. Once the openings are formed, for example by laser drilling, the openings are then filled with a conductive material. This conductive material can be formed by electrolytic or electroless plating and creates a contact point for interconnecting with other devices and/or additional buildup layers.

Figure 6A:
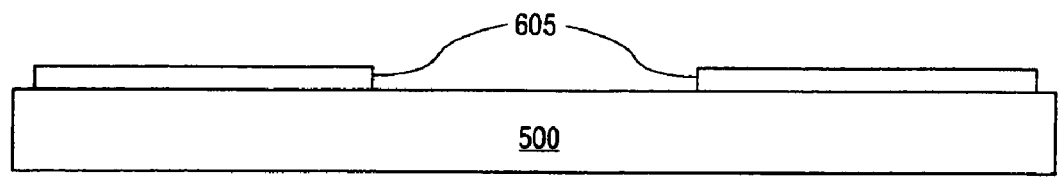
FIG. 6a is a cross-sectional side view of conductive layers formed over a package substrate to form an inductor structure, according to another embodiment.
Figure 6B:
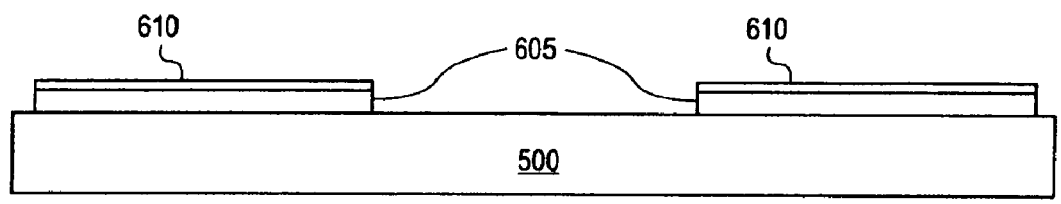
FIG. 6b is a view similar to FIG. 6a after metal-adhesion layers are formed over the conductive layers.
Figure 6C:
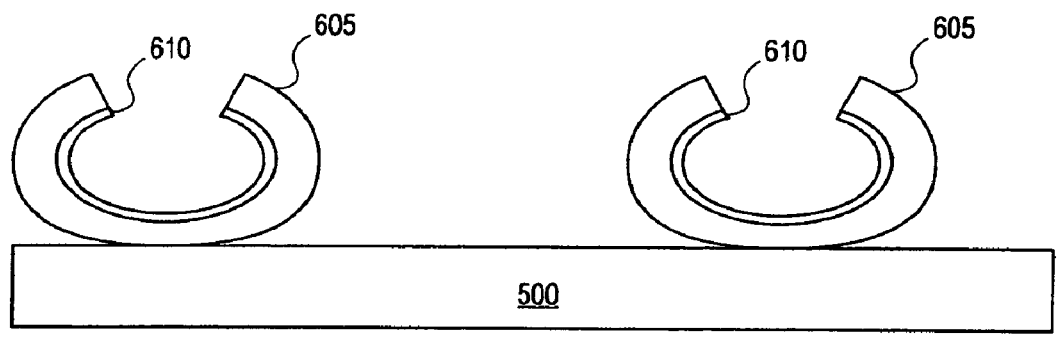
FIG. 6c is a view similar to FIG. 6b after a bowl shape is formed by the conductive layers after subjected to thermal stress.
Figure 6D:
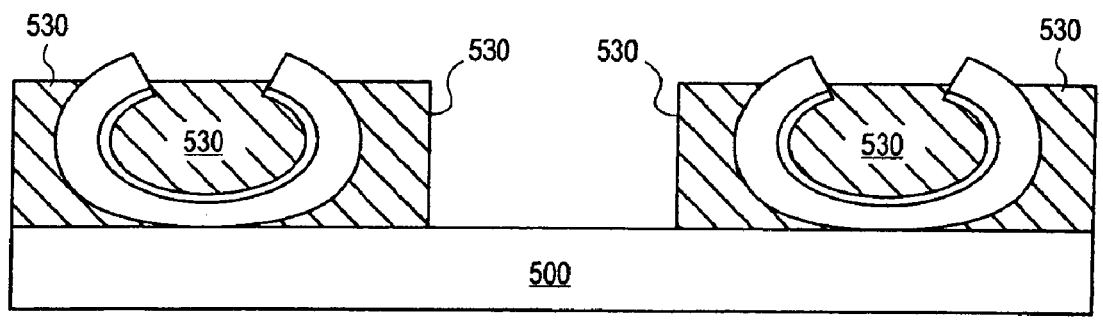
FIG. 6d is a view similar to FIG. 6c after a magnetic material is formed within and around the conductive layers.

In another method of fabrication, the conductive layer of the inductor structure 100 is formed in one operation, as shown in FIGS. 6a-d. FIG. 6a shows the result of using standard electroplating methods to form a conductive layer 605 over a package substrate 500. A metal-adhesion layer 610 is sputtered on the top of the conductive layer 605 to act as a mechanism to at least partially delaminate the conductive layer 605 from the package substrate 500 as shown in FIG. 6b. The metal-adhesion layer 610 is selected to have a greater adhesion with the conductive layer 605 than the adhesion between the conductive layer 605 and the package substrate 500. Subjecting the conductive layer 605 to thermal stresses will at least partially delaminate the conductive layer 605 from the package substrate 500. This process forms the conductive layer 605 into a bowl shaped structure as illustrated in FIG. 6c. As shown in FIG. 6d, a magnetic material 530 is then formed inside and around the conductive layer 605.

Electrical transformers may be used in a variety of microelectronic circuit applications such as, for example, power converters, power delivery devices, power isolation devices, and radio frequency (RF) and microwave circuitry including matching networks, oscillators, amplifiers, and filters. Because discrete transformers result in losses, for example, due to parasitic capacitance and resistance in connecting them to an integrated circuit and because discrete transformers incur a relatively high cost for assembly, embodiments described herein are preferably fabricated on-package, that is either integrated on an integrated circuit and/or in a package housing an integrated circuit. Furthermore, advanced power conversion topologies include transformers as components. By incorporating the transformer array 700 into the package housing of a microelectronic assembly, large UR ratios (inductance/resistance ratios) and large coupling factors (k) of transformers can be achieved, and coupling to neighboring transformers can be minimized.

Figure 7:
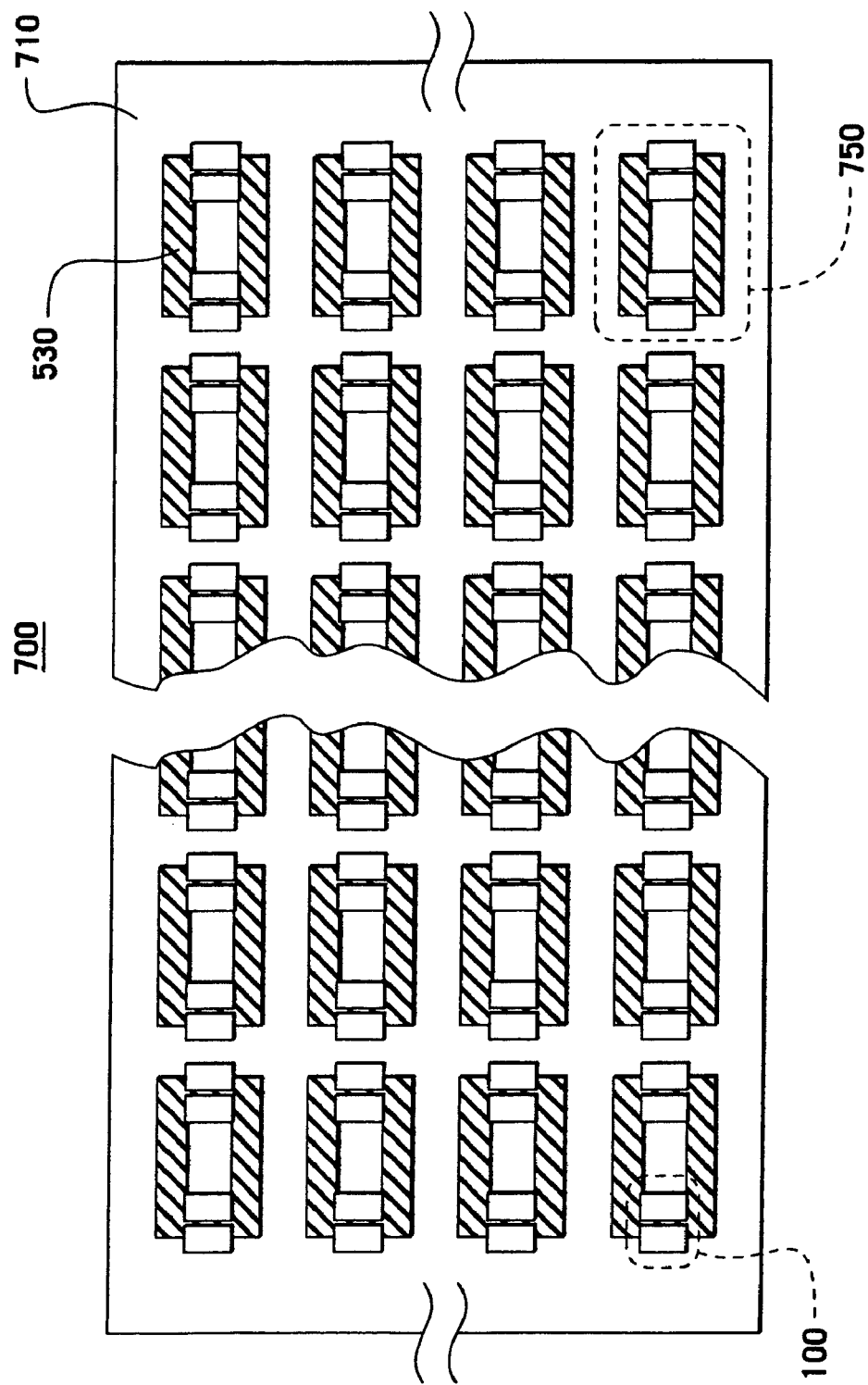
FIG. 7 is an overhead view of a transformer array formed in a package substrate, according to a further embodiment.

FIG. 7 illustrates a transformer array 700 formed in a package substrate 710 (e.g., may be the package substrate 500 as illustrated in FIG. 5), according to one embodiment of the invention. The package substrate 710 may be formed within a build-up packaging layer of a microelectronic package substrate.

Every transformer structure 750 includes two of the inductor structure 100. In another embodiment, there may be any number of single-turn and/or multiple turn inductor structures forming each transformer structure 750. Each inductor structure 100 illustrated in FIG. 7 is magnetically coupled to another inductor structure through the magnetic material 530 to form the transformer structure 750. In addition, every transformer structure 750 is formed using the processes as described in FIGS. 5a-5h and/or in FIGS. 6a-6d.

An embodiment of the package substrate 710 of FIG. 7 includes fabrication of the transformer array 700 from a predetermined number of the inductor structures. In one embodiment, a dielectric material 310, including an Ajinomoto buildup film (ABF); a ceramic; or a solder resist, can be used to separate a transformer structure 750 from one another within the array of transformers 700. One embodiment of the transformer array 700 may include approximately 9-10,000 transformer structures.

In a transformer array 700 embodiment, the transformer structure 750 can be connected to another transformer structure 750 in series, in parallel, and/or to devices external to the array. In addition, series connections of an inductor structure 100 forming the transformer structure 750 may be used to create inductance values equal to the sum of the inductors connected in series. Also, the inductor structure 100 in the transformer array 700 can be connected to another inductor structure 100 in parallel to tune the effective inductance of the combined inductor structure 100 connected together to a certain predetermined inductance. An individual inductor structure 100 in the transformer array 700, a combination of serially connected inductor structures 100, a combination of inductor structures 100 connected in parallel, and/or a combination of inductor structures 100 connected in series and in parallel can be used to connect to devices external to the transformer array 700. Examples of devices external to the transformer array 700 that could be connected to the transformer structure 750 include capacitors, voltage regulator modules, resistors, transistors and other devices useful in electronic design. Embodiments of the transformer array 700 can have the inductor structure 100 orientated on its side, upside down, or in other positions.

In one embodiment the magnetic material 530 of FIG. 7 must be patterned to form a loop (e.g., a single loop, double-loop, or other pattern) so that the magnetic flux can be directed within a transformer (e.g., as a single loop as shown in FIG. 7). By patterning the magnetic material 530 as a loop, the magnetic flux can be directed within each of the transformer structure 750 from a first inductor structure to a second inductor structure (e.g., the magnetic material 530 may also thereby provide small eddy current and/or hysteresis losses, and/or coupling to neighboring transformers may be minimized). In one embodiment, if the resistivity of the magnetic material 530 forming a core of a transformer is not high enough for a particular application, the magnetic material 530 may be coated with a dielectric to prevent leakage and a planar dielectric lamellae may be introduced to reduce eddy currents.

In another embodiment, the transformer array 700 is part of a microelectronic assembly that includes the package substrate 710 (e.g., a package substrate of a microelectronic assembly) and at least one transformer (e.g., the transformer 750) is formed within the package substrate 710. The transformer (e.g., the transformer 750) of the package substrate 710 may be formed with a pair of inductors (e.g., a pair of the inductor 100) each having a single-turn solenoid and a magnetic section (e.g., the magnetic material 530) inside each single-turn solenoid to electro-magnetically couple the pair of inductors. The microelectronic assembly may include a die substrate (e.g., a die substrate 410 as in FIG. 4) connected to the package substrate 710, and a plurality of electronic components formed in and on the die substrate and connected to one another to form an integrated circuit.

Figure 8:
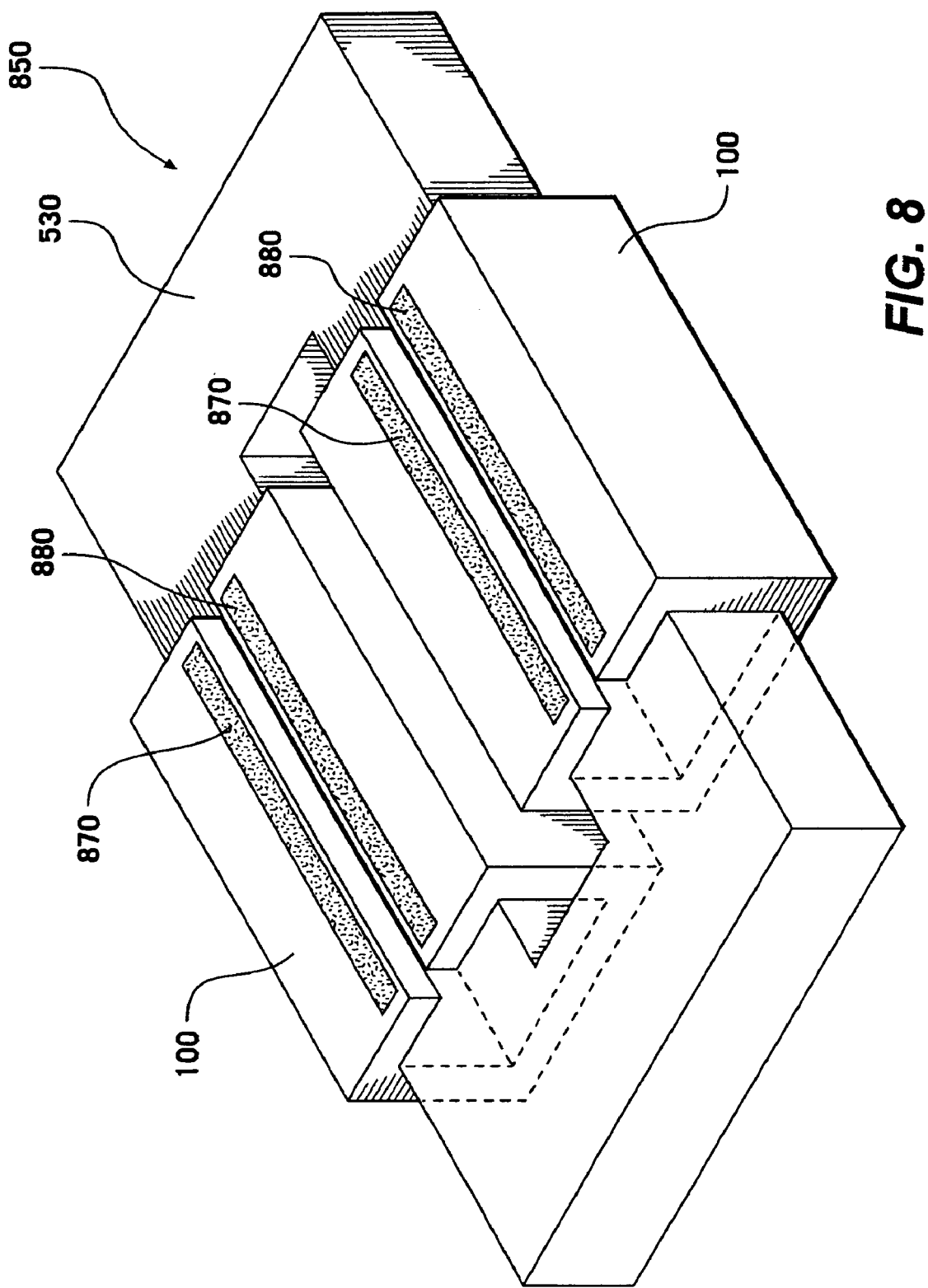
FIG. 8 is a perspective view of a four-terminal transformer structure having a magnetic core formed in a package substrate, according to yet a further embodiment.

FIG. 8 is a perspective view of a four-terminal transformer structure 850 (e.g., two first terminals 870 and two second terminals 880) having a magnetic core (e.g., the magnetic core may be the magnetic material 530 patterned to be between the sidewalls of each of the inductor structures 100 of the four-terminal transformer 850 and to form a closed loop) formed within a package substrate (e.g., the package substrate 500 and/or the package substrate 710). It should be noted that the four-terminal transformer structure 850 is a micro-transformer that avoids high-resistance spiral inductors and which uses a single layer of magnetic material 530. The four-terminal transformer structure 850 may be formed using the processes as described in FIGS. 5a-5h and/or in FIGS. 6a-6d.

Each inductor structure 100 of the four-terminal transformer structure 850 includes a first terminal 870 and a second terminal 880. The first terminal 870 and the second terminal 880 are used to connect the four-terminal transformer 850 to other devices and structures within a microelectronic assembly and/or external to the microelectronic assembly. The first terminal 870 and the second terminal 880 are formed using the second conductive layer 570 and the third conductive layer 580 respectively as previously described in FIG. 5h in one embodiment. In another embodiment, the first terminal 870 and the second terminal 880 are different portions of a top metal layer that has been patterned to form two inductors 100.

Figure 9:
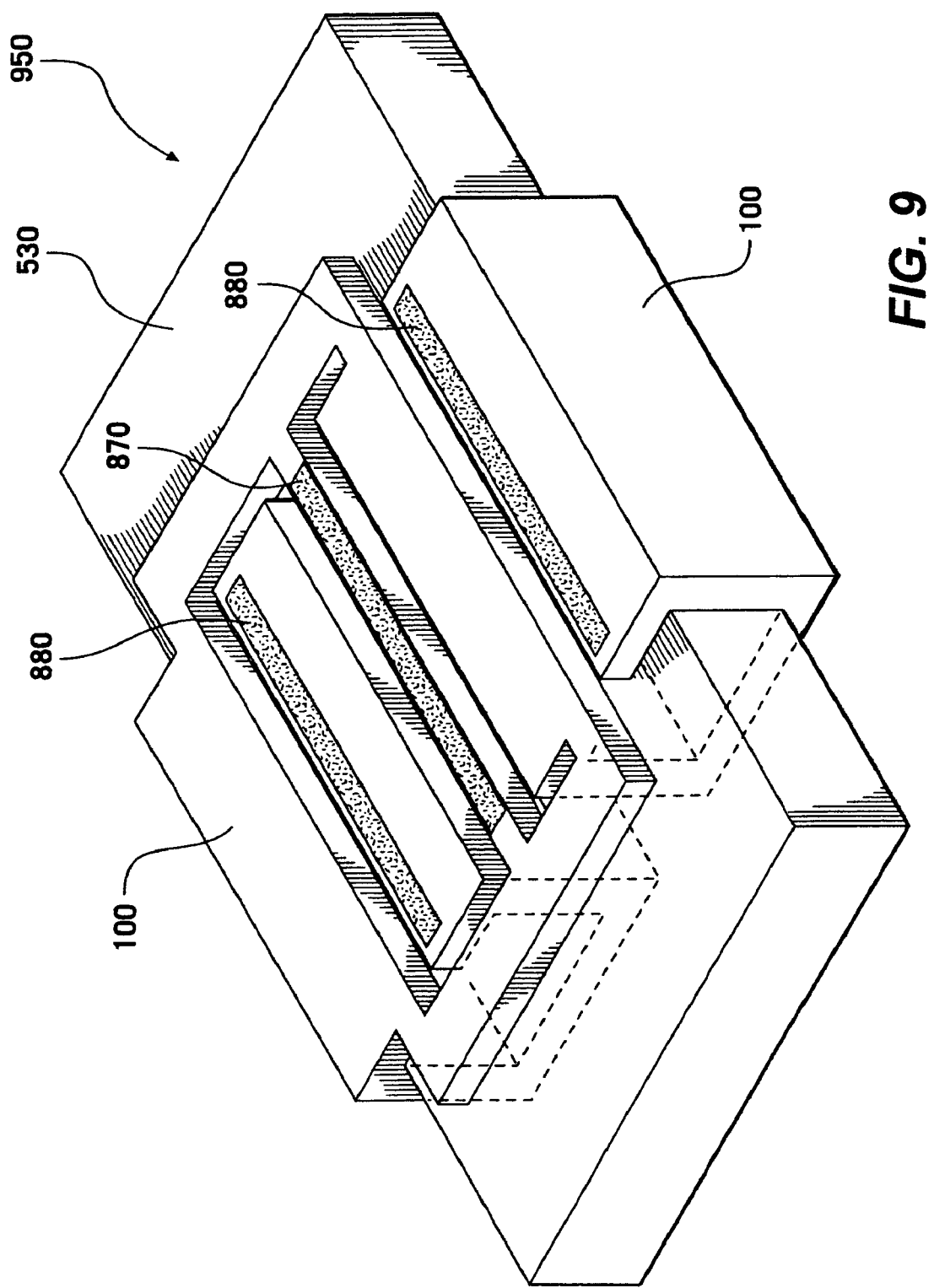
FIG. 9 is a perspective view of a three-terminal transformer structure having a magnetic core formed in a package substrate, according to yet a further embodiment.

FIG. 9 is a perspective view of a three-terminal transformer structure 950 (e.g., one first terminal 870 and two second terminals 880) having a magnetic core (e.g., the magnetic material 530) formed in a package substrate (e.g., the package substrate 500 and/or the package substrate 710). It should be noted that the three-terminal transformer structure 950 may be a micro-transformer that avoid high-resistance spiral inductors and uses a single layer of magnetic material 530. In addition, the three-terminal transformer structure 950 may be formed using the processes as described in FIGS. 5a-5h and/or in FIGS. 6a-6d.

The three-terminal transformer structure 950 of FIG. 9 differs from the four-terminal transformer structure 850 in that the first terminal 870 on each of the two inductors 100 forming the three-terminal transformer structure 950 in FIG. 9 have been shorted together (with the correct mutual orientation of magnetic fluxes generated by the two inductors). In one embodiment, a top metal layer is patterned to short the first terminal 870 on each of the two inductors 100 forming the three-terminal transformer structure 950 together. In another embodiment, the three-terminal transformer structure 950 of FIG. 9 is formed by a new metal layer above a metal layer that forms the first terminal 870 and the second terminal 880 on each of the two inductors 100 of the four-terminal transformer structure 850 of FIG. 8.

Figure 10:
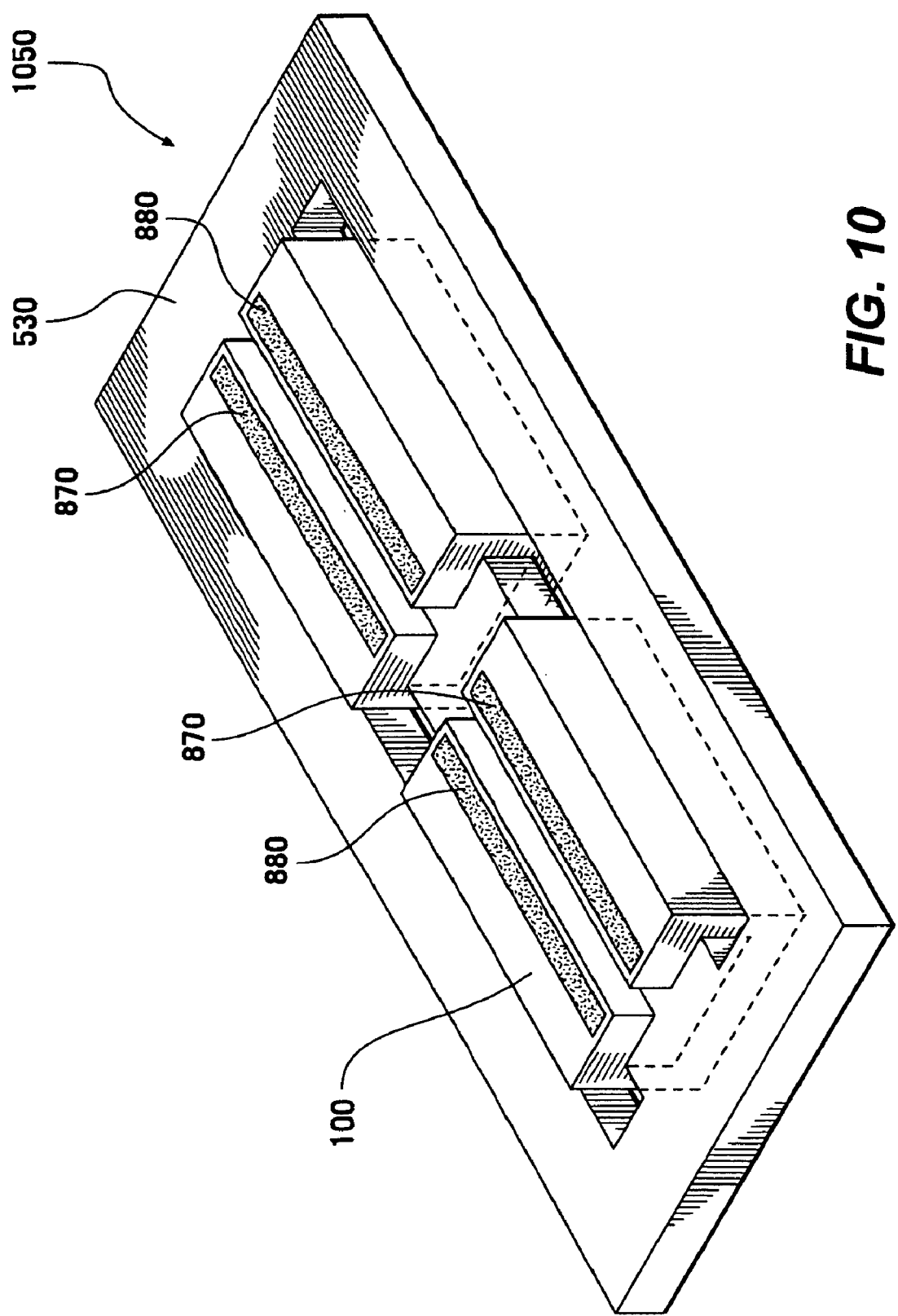
FIG. 10 is a perspective view of a four-terminal transformer structure in double-loop pattern having a magnetic core formed in a package substrate, according to yet a further embodiment.

FIG. 10 is a perspective view of a four-terminal transformer structure 1050 (e.g., two first terminals 870 and two second terminals 880) in double-loop pattern in having a magnetic core (e.g., the magnetic material 530) formed in a package substrate (e.g., the package substrate 500 and/or the package substrate 710), according to one embodiment. It should be noted that the four-terminal transformer structure 1050 may be a micro-transformer that avoids high resistance-spiral inductors and uses a single layer of magnetic material 530. In addition, the four-terminal transformer structure 1050 may be formed using the processes as described in FIGS. 5a-5h and/or in FIGS. 6a-6d.

The four-terminal transformer structure 1050 has a "double-loop" because the magnetic material 530 forms the shape of a "figure eight" between and surrounding each of the inductors 100 forming the four-terminal transformer structure 1050.

Figure 11:
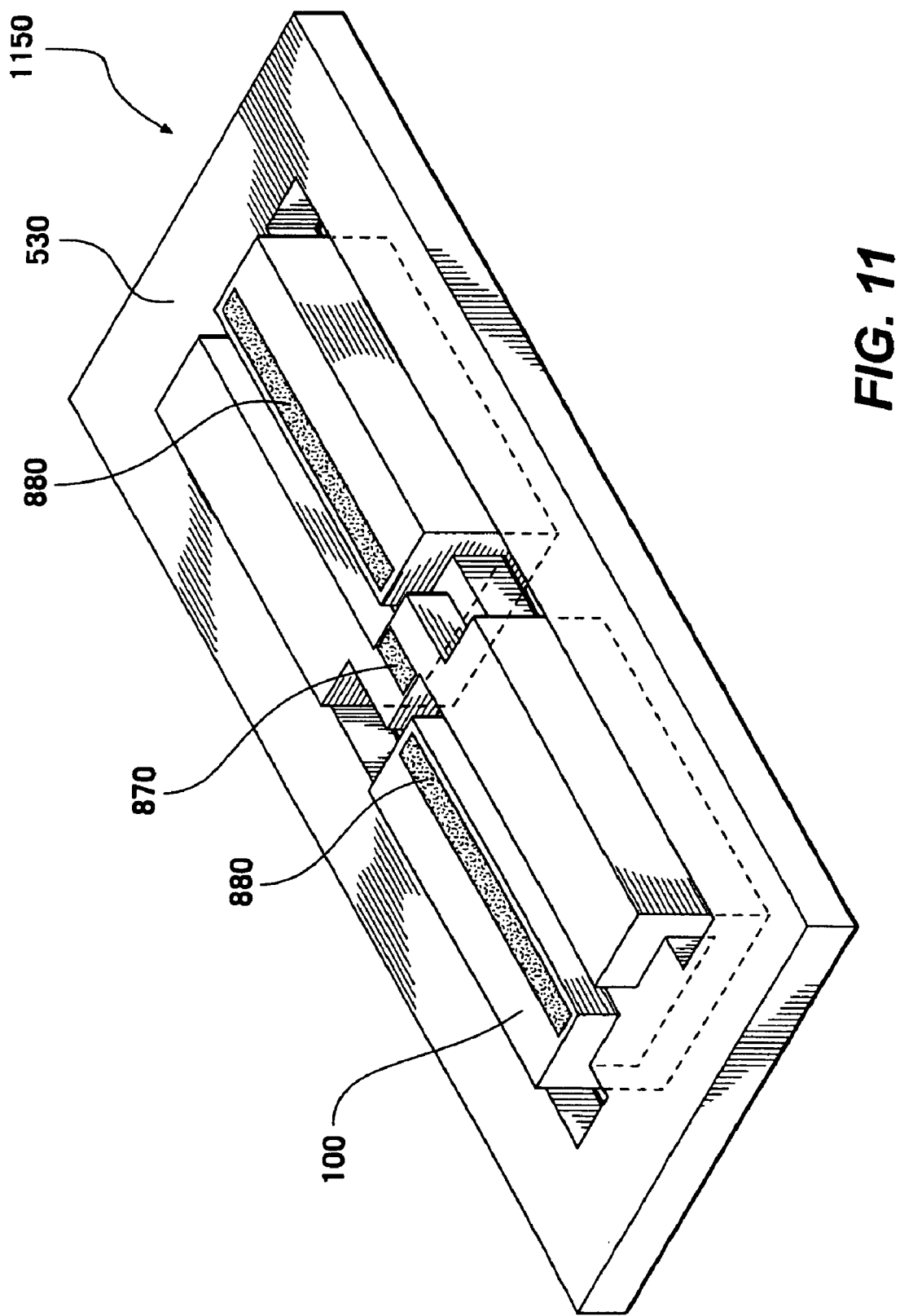
FIG. 11 is a perspective view of a three-terminal transformer structure in double-loop pattern in having a magnetic core formed in a package substrate, according to yet a further embodiment.

FIG. 11 is a perspective view of a three-terminal transformer structure 1150 (e.g., one first terminal 870 and two second terminals 880) in double-loop pattern in having a magnetic core formed in a package substrate (e.g., the package substrate 500 and/or the package substrate 710), according to one embodiment. It should be noted that the three-terminal transformer structure 1150 may be a microtransformer that avoid high-resistance spiral inductors and uses a single layer of magnetic material 530. In addition, the three-terminal transformer structure 1150 may be formed using the processes as described in FIGS. 5a-5h and/or in FIGS. 6a-6d.

The three-terminal transformer structure 1150 of FIG. 11 differs from the four-terminal transformer structure 1050 of FIG. 10 in that the first terminal 870 on each of the two inductors 100 forming the three-terminal transformer structure 1150 in FIG. 11 have been shorted together (with the correct mutual orientation of magnetic fluxes generated by the two inductors). In one embodiment, a top metal layer is patterned to short the first terminal 870 on each of the two inductors 100 forming the three-terminal transformer structure 1150. In another embodiment, the three-terminal transformer structure 1150 of FIG. 11 is formed by new metal layer above the metal layer that forms the first terminal 870 and the second terminal 880 on each of the two inductors 100 of the four-terminal transformer structure 1050 of FIG. 10. The double-loop pattern of the four-terminal transformer structure 1050 leads to a balanced three-terminal transformer structure 1150 (e.g., balanced by making equal the resistances between the first terminal 870 and the second terminal 880 on each of the two inductors 100 and maintaining point symmetry about the center of the structure, including the magnetic material 530 and the in operation electromagnetic fields).

Figure 12:
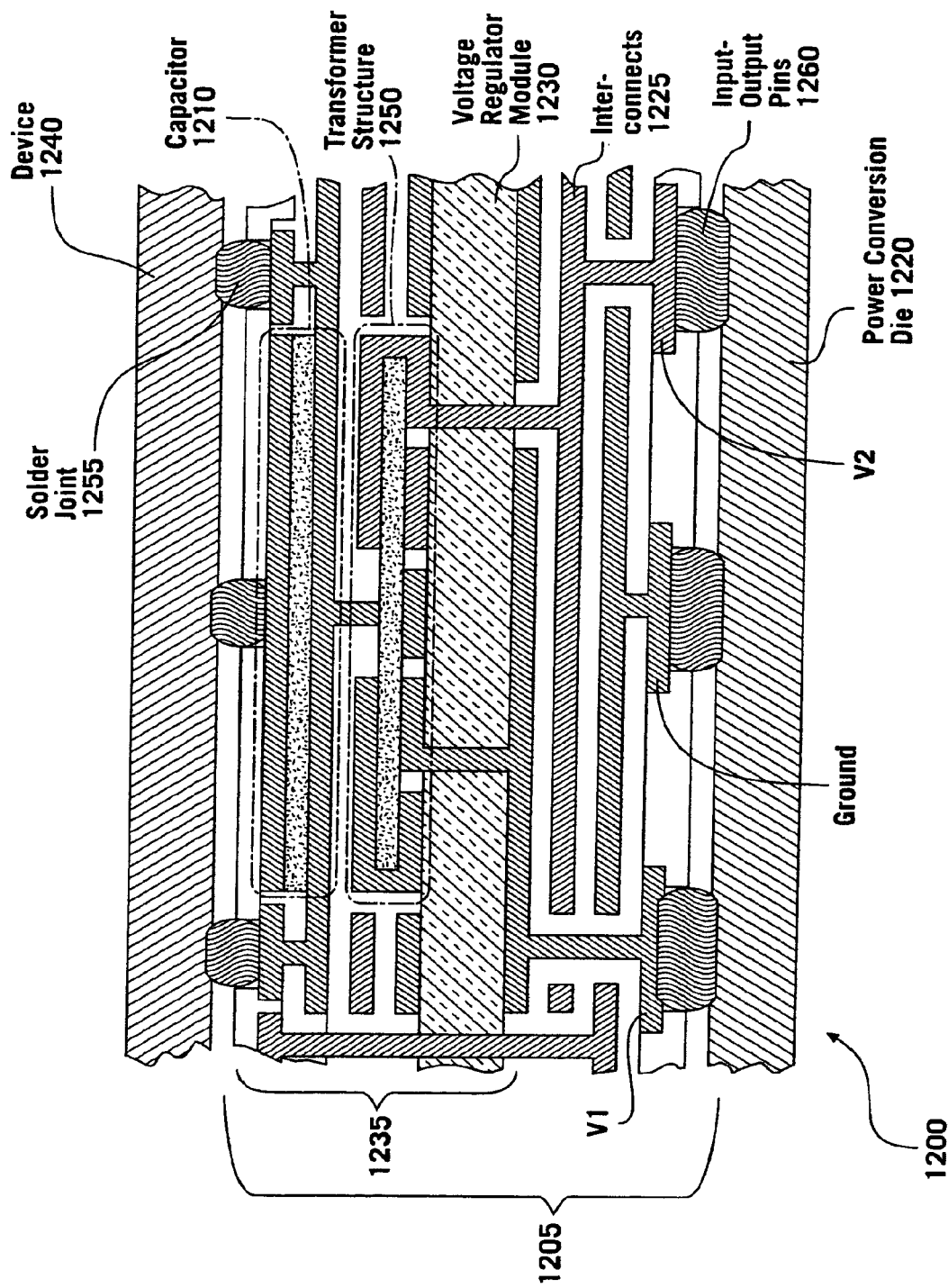
FIG. 12 is a cross-sectional side view of the transformer structure incorporated into the build-up package layers of an integrated circuit package.

FIG. 12 illustrates a portion of an integrated circuit package view of a transformer structure 1250 incorporated into the build-up package layers 1235 of a microelectronic assembly 1200, according to one embodiment. As shown in FIG. 12, one embodiment of the transformer structure 1250 (e.g., the transformer structure 1250 may be the array of transformers 700, and may have the properties of any one or more of the transformers described in FIGS. 7-11), can be fabricated into the build-up layers 1235 of an integrated circuit package substrate 1205. This build-up layers 1235 could contain passive components including parallel-plate capacitors (e.g., the capacitor 1210) and interact with a power conversion die 1220, implementing for example the buck converter circuit 200 of FIG. 2. In one embodiment, the transformer structure 1250 is incorporated into a smoothing filter of a power converter.

An embodiment of an transformer structure 1250 in the transformer array 700 and/or a combination of connected inductors 100 contained in the transformer array 700 contained within the build-up layers 1235 can be used in conjunction with an array of voltage regulator modules (VRMs) contained in the power conversion die 1210. Such an embodiment can be used as a part of a power conversion circuit, such as a buck converter circuit 200, to power a device 1240 (e.g., an integrated circuit die such as a microprocessor die). One embodiment positions the transformer array 700 between the device 1240 and the power conversion die 1210 as illustrated in FIG. 12. The power conversion circuit formed converts a higher supply voltage to a lower voltage that is then coupled to the power grid of the device 1240. Since the power conversion circuit is separated from the circuits on the device 1240 by the distance covered by the connections, which can be on the order of a few tens of microns in length, the lowered-voltage supply can be distributed in a manner minimizing IR and Ldi/dt voltage drops.

In an embodiment, a transformer structure 1250 (e.g., an array of the transformer structure 1250) can be coupled to a device 1240 by die bonding techniques including flip-chip solder joints 1255, bumpless build-up layer (BBUL), solder bumps, or wire bond. In a BBUL embodiment, the package is built up around the device 1240, so that the die is contained within the package substrate core. The device 1240 is then connected to build-up layers 1235 and/or input/output (I/O) pins 1260 using interconnections 1225. The transformer structure 1250 includes V1, V2, and Vcc connection points connected to various I/O pins 1260 and solder joints 1255. Other embodiments of the microelectronic assembly 1200 of FIG. 12 may incorporate aspects of the inductor structure as previously described in FIG. 4.

In one embodiment, the microelectronic assembly 1200 may include a die substrate (e.g., part of the device 1240 and/or part of the power conversion die 1220) and a plurality of electronic components formed in and on the die substrate (e.g., electronic components formed on the device 1240 and/or the power conversion die 1220) and connected to one another to form an integrated circuit (e.g., the device 1240 and/or the power conversion die 1220).

The microelectronic assembly 1200 of FIG. 12 may include a first and a second single-turn inductor (e.g., the inductors 100 as previously described in FIGS. 1-11), and a magnetic material (e.g., the magnetic material 530) electromagnetically coupling the first and the second single-turn inductor to one another to form a transformer (e.g., the transformer structure 1250), the transformer being connected to the integrated circuit (e.g., the device 1240 and/or the power conversion die 1220).

In one embodiment, a first single-turn inductor and a second single-turn inductor of the microelectronic assembly 1200 are formed from a group comprising of copper and 0.05% copper doped aluminum. In another embodiment, the magnetic material (e.g., the magnetic material 530) of the microelectronic assembly 1200 is a soft magnetic material with a relative permeability of about 95-900 and/or has a resistivity of 102 micro-ohms times centimeter, and/or is stable until at least 400 degrees Celsius. Furthermore, the magnetic material (e.g., the magnetic material 530) of the microelectronic assembly 1200 may have a uniaxial anisotropy and/or a ferromagnetic resonance frequency of 1.4 GHz. In one embodiment, the magnetic material (e.g., the magnetic material 530) of the microelectronic assembly 1200 is a magneto-dielectric (e.g., may comprise an amorphous cobalt alloy), and/or has a relative permeability of about 300.

The microelectronic assembly 1200 may include a package substrate (e.g., the integrated circuit package substrate 1205). The die substrate (e.g., the device 1240) may be mounted to the package substrate, and the transformer (e.g., the transformer structure 1250 and/or an array of the transformer structure 1250) may be integrated within the package substrate.

The microelectronic assembly 1200 may include a first conductive layer within the package substrate (e.g., the integrated circuit package substrate 1205). A magnetic layer may be formed over the first conductive layer that includes the magnetic material 530 and which is patterned into a plurality of loops. The microelectronic assembly may include at least a first loop of the plurality of loops that has a single loop pattern (e.g., as shown in FIGS. 7, 8, and 9) and at least a second loop of the plurality of loops that has a double-loop pattern (e.g., as shown in FIGS. 10 and 11).

The microelectronic assembly 1200 may include a set of conductive sidewalls (e.g., as described in FIG. 5a-5h) that are formed through the plurality of loops and which are connected to the first conductive layer, at least some sidewalls of the set of conductive sidewalls being magnetically coupled to each other through a loop within the plurality of loops. Furthermore, the microelectronic assembly may include a set of conductive sidewalls that are formed by vias at orthogonal angles to the package substrate (e.g., as described in FIG. 5a-5h). In addition, the microelectronic assembly 1200 may include a set of conductive portions formed on opposing sides of the magnetic layer from the first conductive layer wherein each conductive portion within the set of conductive portions is connected to each sidewall within the set of conductive sidewalls.

In another embodiment, the microelectronic assembly 1200 may include a package substrate (e.g., the package substrate 1205), a power terminal on the package substrate, a plurality of signal terminals on the package substrate, and a first single-turn inductor (e.g., the inductor structure 100) integrated in the package substrate and being electrically connected to the power terminal. A second single-turn inductor may also be integrated in the package substrate. Furthermore, a magnetic material may be integrated in the package substrate and electro-magnetically couple the first and second single-turn inductors to one another so that the first and second single-turn inductors and the magnetic material form a transformer (e.g., the transformer structure 1250). A first power contact on the package substrate (e.g., the package substrate 1205) may electrically connect to the second single-turn inductor. Furthermore, a plurality of signal conductors in the package substrate may connect the plurality of signal terminals to a first set of signal contacts on the package substrate.

The microelectronic assembly may also be formed when a die substrate (e.g., a device 1240) is mounted on the package substrate 1205. A second power contact in the integrated circuit (e.g., the device 1240) may be electrically connected to the first power contact in the package substrate (e.g., the package substrate 1205); and to a second set of signal contacts in the integrated circuit that are electrically connected to the first set of signal contacts in the package substrate.

The transformer structure 1250 of FIG. 12 may be formed in a variety of ways. A method of forming the transformer structure 1250 may include forming a first conductive layer; forming a magnetic layer over the first conductive layer; patterning the magnetic layer into a plurality of loops; forming, through the plurality of loops, a set of conductive sidewalls that are connected to the first conductive layer, at least some sidewalls of the set of conductive sidewalls being magnetically coupled to each other through a loop within the plurality of loops; and forming a set of conductive portions formed on opposing sides of the magnetic layer from the first conductive layer wherein each conductive portion within the set of conductive portions is connected to each sidewall within the set of conductive sidewalls.

Numerous methods may be performed on the package substrate 1205 of FIG. 12 to create the transformer structure 1250. A method on a package substrate may include forming a first seed layer on the package substrate; electroplating a first conductive layer on the first seed layer; depositing a layer having magnetic properties over the first conductive layer; patterning the layer having magnetic properties into a plurality of loops; laser drilling a first via set in the plurality of loops to form opposite first and second sidewalls connected to the first conductive layer; laser drilling a second via set in the plurality of loops to form opposite third and fourth sidewalls connected to the first conductive layer and magnetically coupled to the first and second sidewalls; forming a second seed layer on the first and second via sets and the plurality of loops; forming a dry film resist over the second seed layer; creating openings in the dry film resist in predetermined locations; electroplating a second conductive layer in the openings; and removing the dry film resist and the second seed layer.

It should be noted that the embodiments disclosed herein may be applied to the formation of any microelectronic assembly. Certain features of the embodiments of the claimed subject matter have been illustrated as described herein, however, modifications, substitutions, changes and equivalents will be evident to those skilled in the art. Additionally, while several relationships have been described in detail, it is contemplated by those of skill in the art that several of the methods may be performed without the use of the others, or additional functions or relationships between methods may be established and still remain in accordance with the claimed subject matter. It is, therefore, to be understood that the appended claims are intended to cover all such modifications and changes as fall within the true spirit of the claimed subject matter.

I claim:

1. A microelectronic assembly, comprising:
   a package substrate;
   a power terminal on the package substrate;
   a plurality of signal terminals on the package substrate;
   a first single-turn inductor integrated in the package substrate and being electrically connected to the power terminal;
   a second single-turn inductor formed in the package substrate;
   a magnetic material integrated in the package substrate and electro-magnetically coupling the first and second single-turn inductors to one another so that the first and second single-turn inductors and the magnetic material form a transformer;
   a first power contact on the package substrate and electrically connected to the second single-turn inductor; and
   a plurality of signal conductors in the package substrate, each connecting the plurality of signal terminals to a first set of signal contacts on the package substrate.

2. The microelectronic assembly of claim 1 wherein the first single-turn inductor and the second single-turn inductor are formed from a group comprising of copper and 0.05% copper doped aluminum.

3. The microelectronic assembly of claim 1 wherein the magnetic material is a soft magnetic material with a relative permeability of about 95-900.

4. The microelectronic assembly of claim 3 wherein the magnetic material has a resistivity of 102 micro-ohms times centimeter, and is stable until at least 400 degrees Celsius.

5. The microelectronic assembly of claim 1 wherein the magnetic material has a uniaxial anisotropy and a ferromagnetic resonance frequency of 1.4 GHz.

6. The microelectronic assembly of claim 1 wherein the magnetic material is a magneto-dielectric.

7. The microelectronic assembly of claim 6 wherein the magneto-dielectric has a relative permeability of about 300.

8. The microelectronic assembly of claim 7 wherein the magneto-dielectric comprises an amorphous cobalt alloy.

9. The microelectronic assembly of claim 1 further comprising a package substrate, the die substrate being mounted to the package substrate, and wherein the transformer is integrated within the package substrate.

10. The microelectronic assembly of claim 9 wherein the transformer is one of a plurality of transformers formed within the package substrate.

11. The microelectronic assembly of claim 9 further comprising a first conductive layer within the package substrate.

12. The microelectronic assembly of claim 11 further comprising a magnetic layer over the first conductive layer that includes the magnetic material and which is patterned into a plurality of loops.

13. The microelectronic assembly of claim 12 wherein at least a first loop of the plurality of loops has a single loop pattern and at least a second loop of the plurality of loops has a double-loop pattern.

14. The microelectronic assembly of claim 12 further comprising a set of conductive sidewalls that are formed through the plurality of loops and which are connected to the first conductive layer, at least some sidewalls of the set of conductive sidewalls being magnetically coupled to each other through a loop within the plurality of loops.

15. The microelectronic assembly of claim 14 wherein the set of conductive sidewalls are formed by vias at orthogonal angles to the package substrate.

16. The microelectronic assembly of claim 14 further comprising a set of conductive portions formed on opposing sides of the magnetic layer from the first conductive layer wherein each conductive portion within the set of conductive portions is connected to each sidewall within the set of conductive sidewalls.

17. The microelectronic assembly of claim 1 wherein the transformer is used in conjunction with power conversion circuitry.

18. The microelectronic assembly of claim 17 wherein the transformer is incorporated into a smoothing filter of a power converter.

* * * * *

UNITED STATES PATENT AND TRADEMARK OFFICE
CERTIFICATE OF CORRECTION

| | | |
|---|---|---|
| PATENT NO. | : 7,280,024 B2 | Page 1 of 1 |
| APPLICATION NO. | : 11/050379 | |
| DATED | : October 9, 2007 | |
| INVENTOR(S) | : Braunisch | |

It is certified that error appears in the above-identified patent and that said Letters Patent is hereby corrected as shown below:

In column 6, at line 59, delete "UR", and insert --L/R--

Signed and Sealed this

Twenty-seventh Day of May, 2008

JON W. DUDAS
*Director of the United States Patent and Trademark Office*